United States Patent [19]
Downar et al.

[11] Patent Number: 5,721,197
[45] Date of Patent: Feb. 24, 1998

[54] CONTROLLABLE SUPERCONDUCTOR COMPONENT

[75] Inventors: Hartmut Downar, Salem; Werner Scherber, Bermatingen; Thomas Peterreins, Regensburg; Paul Ziemann, Radolfzell, all of Germany

[73] Assignee: Dornier GmbH, Germany

[21] Appl. No.: 540,134

[22] Filed: Oct. 6, 1995

Related U.S. Application Data

[63] Continuation of Ser. No. 263,335, Jun. 21, 1994, abandoned.

[30] Foreign Application Priority Data

Jun. 21, 1993 [DE] Germany ............. 43 20 484.8

[51] Int. Cl.⁶ ........................................... H01L 39/10
[52] U.S. Cl. ............... 505/238; 505/220; 505/701; 428/688; 428/689; 428/702; 428/930; 428/209; 428/210
[58] Field of Search ......................... 505/190, 220, 505/238, 701; 257/33; 428/209, 210, 901, 688, 930, 689, 702

[56] References Cited

U.S. PATENT DOCUMENTS

| | | | |
|---|---|---|---|
| 4,498,228 | 2/1985 | Jillie, Jr. ........................ | 29/584 |
| 4,504,552 | 3/1985 | Kim .............................. | 428/620 |
| 4,548,834 | 10/1985 | Tsuge ........................... | 427/63 |
| 5,055,158 | 10/1991 | Gallagher ..................... | 505/728 |
| 5,102,862 | 4/1992 | Okabe ........................... | 505/702 |
| 5,326,745 | 7/1994 | Nishino ......................... | 505/220 |

FOREIGN PATENT DOCUMENTS

| | | |
|---|---|---|
| 0 523 279 A1 | 1/1993 | European Pat. Off. . |
| 0 533 519 A2 | 3/1993 | European Pat. Off. . |
| 0 534 811 A2 | 3/1993 | European Pat. Off. . |

OTHER PUBLICATIONS

European Search Report dated Sep. 23, 1994.
Koinuma et al, Jap. Journ. Appl. Phys. vol. 26 No. 5, May 1987, pp. L763–765.
Geballe, Science vol. 259, Mar. 12, 1993 pp. 1550–1551.
Nakajima et al., Appl. Phys. Lett 53(15) Oct. 10, 1988 pp. 1437–1439.

*Primary Examiner*—Marie Yamnitzky
*Attorney, Agent, or Firm*—Evenson, McKeown, Edwards & Lenahan, P.L.L.C.

[57] ABSTRACT

A microelectronic thin-film device having a thin superconducting layer in contact with a thin quasi-insulating conversion layer. The critical current of the superconducting layer is controlled by application of a voltage to the conversion layer by means of a gate electrode, causing the conversion layer to undergo an insulator-metal transition.

19 Claims, 4 Drawing Sheets

CONTROLLABLE SUPERCONDUCTOR COMPONENT

This application is a continuation of application Ser. No. 08/263,335, filed on Jun. 21, 1994 (now abandoned).

BACKGROUND OF THE INVENTION

This invention relates to a new type of thin-film superconductor device with an active control and amplifier function. Such devices have potential application in the fields of microelectronics, communication technology, microwave technology and data processing, among others.

With the discovery of high-temperature superconductors, which can be used at temperatures above 77 K (boiling point of nitrogen), new prospects have arisen for the implementation of low-loss fast electronic circuits. While conventional low-temperature superconductors (NTSL) require costly cooling close to the absolute zero point and are therefore very limited in their application, the possibility of operation at nitrogen temperatures opens up a much larger application spectrum. Furthermore, other high-performance semiconductor devices, such as low-noise detectors or ultra-high frequency circuits, are also operated in this temperature range in order to utilize their full efficiency.

Because of special transport mechanisms, superconductors offer very interesting advantages for use in electronic circuits: high current densities, minimal conductor cross-sections, very low power dissipation at maximum frequencies, and others. On the other hand, a fundamental problem exists with respect to the realization of superconductor circuits: Active controllable elements, so-called triodes or three-terminal devices corresponding to the semiconductor transistor, have not been achievable in a superconducting mode, at least at competitive cost. Thus, their potential can be utilized only to a limited extent. Although high performance discrete components, such as strip lines, inductive resistors, resonators, antennas, etc., can be produced, these must be connected in a relatively high-expenditure hybrid circuit with the active semiconductor components so that, on the whole, there is no convincing advantage.

The various known auxiliary arrangements for controlling superconductor characteristics by means of magnetic fields, by temperature control, by radiation, etc., are not effective because they are either too slow, allow no positive amplification, cannot be miniaturized or for other reasons cannot be used as electronic components analogously to the transistor.

As long as the use of the superconductors was limited to the lowest temperature range (conventional superconductors), this disadvantage was not particularly apparent because of the lacking applicability. However, with the availability of high-temperature superconductors, the situation has changed completely. That is, combined operation with cooled semiconductor circuits is now possible at one temperature level. In addition, purely superconducting circuits may now compete with such cooled semiconductor circuits. Thus, extensive research has been devoted to the development of the "supertransistor", of the "Super-FET" or similar devices.

The difficulties in implementing active superelements are well-known. A primary problem is the fact that the mechanisms used in semiconductor structures are based on space charge effects and field effects, which basically do not occur in a comparable form in superconductors. Completely different control mechanisms must therefore be developed and used.

A second serious problem is the technology required for production of the new superconductors. That is, these devices consist of oxidic substances of a complex crystalline structure (such as $YBa_2Cu_3O_7$) and require special coating processes, which are carried out at high temperatures (up to 800° C.) and strictly controlled environmental conditions. The manufacturing conditions are so critical that the preparation of multilayer structures, which is a prerequisite for integrated circuits, has been extremely difficult up to now. Even the placing of two perfect superconductor layers one above another with an insulator layer in-between, for example for normal wiring crossovers, presents considerable technological problems, and has succeeded only in individual cases and on small areas.

It is an object of the present invention to provide a superconducting electronic device, particularly one using high-temperature superconductors, which makes it possible to influence directly by means of a control electrode (gate) the conductivity of a superconducting layer. The new device must be suitable in structure, size, and manufacturing technique for use as a component of integrated microelectronic circuits, and must link the known advantages of superconductors (low impedance, low losses, low voltage level, dispersion-free high-frequency transmission, etc.) with the possible function of switching, controlling or signal amplification.

SUMMARY OF THE INVENTION

According to the invention, the above object is achieved by a thin-film element having a superconductor layer which is separated from a metal electrode or gate by a relatively thin conversion layer. The conversion layer undergoes an insulator-metal transition in response to the application of a small electric current to the gate, which causes a large change in the conductivity of the adjacent superconducting layer. In this manner, amplification factors ranging as high as 100 to 1,000 as defined below can be achieved.

Other objects, advantages and novel features of the present invention will become apparent from the following detailed description of the invention when considered in conjunction with the accompanying drawings.

DETAILED DESCRIPTION OF THE DRAWINGS

Figure 1:
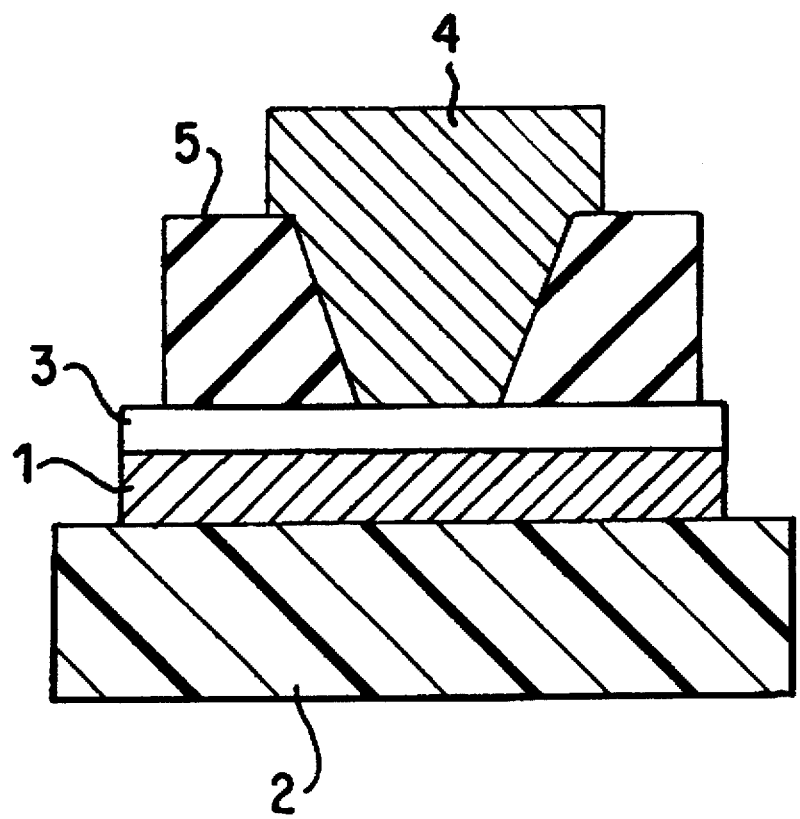
FIG. 1 is a schematic depiction of a thin-film superconducting element according to the invention.

As shown in FIG. 1, a superconductor layer is deposited and patterned on a suitable substrate 2 according to known methods. On a portion of the superconductor layer, a special, quasi-insulating layer (conversion layer) 3 is deposited and a metal electrode (gate) 4 is placed over it, again according to known methods. The layer configuration may therefore be described as a MIS-element (metal insulator superconductor). A novel feature of the invention is that an electron transfer by way of the gate causes a reversible change of the conductivity by several orders of magnitude in the thin conversion layer, whereby the transport characteristics in the adjacent superconductor may be controlled.

The device according to the invention is basically suitable for any superconductor type; however, the materials and corresponding layer thicknesses of the conversion layer and the gate electrode must be carefully adapted to one another. The thickness of the conversion layer should be on the same order of magnitude as the free path length of the injector electrons, approximately 5 to 20 nm; in any case, it should be larger than the layer thickness of tunnel barriers and smaller than the thickness of high-resistance gate oxides. In view of the switching effect, the layer thickness of the superconductor should be adjusted to be as low as possible and, in addition, depends on the required current in the superconducting and normal conducting condition. The permissible maximal superconductor layer thickness, as known from the proximity effect, depends mainly on the coherence length. Depending on the superconductor type, typical values are between 1 and 100 nm.

In one embodiment of the invention, the element niobium was used for the superconductor and niobium oxide $NbO_x$ was used for the conversion layer. The latter should also be suitable for other low-temperature superconductors, such as lead, aluminum, etc. When representatives of a material class with an insulator-metal phase transition (explained in more detail below) are used for the conversion layer, it should be taken into account that the transition temperature must be above the operating temperature of the superconductor. For high-temperature superconductors, such as $YBa_2Cu_3O_7$, for example, vanadium oxide $V_2O_3$ (transition at 150 K), NiS (250 K) or $Ti_2O_3$ (>300 K) are therefore attractive.

In simplified terms, an insulator—metal transition takes place in the conversion layer. Various physical control mechanisms can be used to stimulate and regulate such a transition. However, regardless of the control mechanism that is used the resulting drastic change of conductivity in the conversion layer adjacent to the superconductor provides the vehicle for control of the characteristics of the superconductor in every case. In the simplest case, the conductivity of the conversion layer can be controlled by the tunnelling of electrons into its conduction band by applying a voltage of several volts between the gate and the superconductor, close to the breakdown voltage of the conversion layer.

Materials which are known to undergo an insulator—metal transition in the form of a phase transition seem particularly suitable as the conversion layer, as is discussed for example in N. F. Mott, E. A. Davis: Electronic Processes in Non-Crystalline Materials; Clarendon Press Oxford (1971), Page 121. Such phase transitions are found, for example, in compounds of the transition metals, such as oxides of vanadium, tungsten, niobium, titanium, etc., as well as in their mixed oxides. The common characteristic of these substances is that a drastic change of the electronic conductivity can be caused by temperature variations. As a rule, above a certain transition temperature, the metallic phase exists with a high conductivity, and in the case of lower temperatures, an insulating or semiconducting phase exists which has a considerably lower conductivity. The phase transition may be the result of a normal change of the crystal modification. However, it is also possible that it may be caused primarily by a change of the electronic band structure of the crystal, the lattice structure being essentially maintained. An example is the so-called Anderson transition which is caused by the delocalization of charge carriers, as disclosed in P. W. Anderson, Phys. Rev. 111, 1029 (1958). The released charge carriers populate the conduction band and generate a considerable increase of the conductivity. The delocalization can most easily be caused and observed by thermal activation, but is not limited to it.

Figure 2:
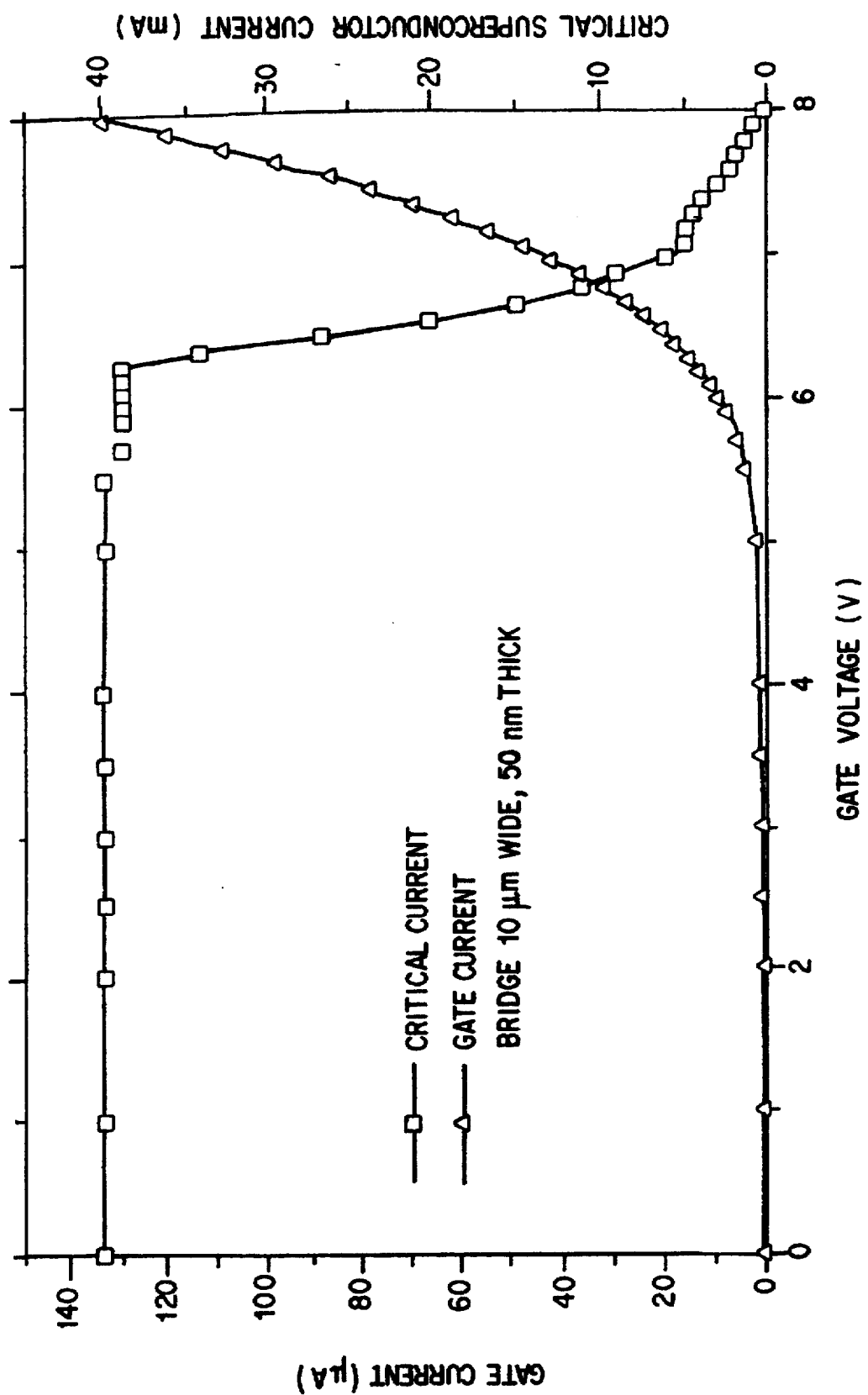
FIG. 2 is a graphic presentation of gate current and critical superconducting current as a function of gate voltage for the element according to the invention.

For the conversion layer to be used in the superconductor device according to the invention, however, only materials which have an electrically caused phase transition can be used, such as noted previously. It has been demonstrated by experiments that current conduction in the superconductor layer of FIG. 1 can be controlled very effectively by a voltage at the gate. FIG. 2 shows a typical characteristic curve of the device, which illustrates that the critical current of the superconductor path of 40 mA is completely suppressed by a gate signal; that is, a complete transition takes place from the superconducting state into the normal conducting condition. The control current which flows through the gate (contact area 10 μm×10 μm) in this case, is around 100 μA. However, even in the case of a gate current of a few μA, an influence can be observed on the critical current density in the superconductor.

Comparing the device according to the invention with prior art systems, thin-film structures are known in which high-energy quasi-particles are injected into the superconductor to change its transport characteristics. This approach is discussed in T. Kobayashi, K. Hashimoto, U. Kabasawa, M. Tonouchi: Three Terminal YBaCuO Josephson Device with Quasi-Particle Injection Gate; IEEE Transactions on Magnetics 25, 927–930 (1989). See also, K. Takeuchi, Y. Okabe: Injection Controlled Superconducting Links; Jpn. J. Appl. Phys. 28, 1810–1815 (1989). Qualitatively, the characteristic curves of these structures have a shape similar to those of the device according to the invention; however, much higher currents are required to switch the superconductor, which appears to be based on a different operating mechanism altogether. If, as is common in prior art literature, a current amplification factor is defined as a (differential) quotient of the switched critical current in the superconductor to the injected gate current, the systems described in literature reach values around 1 to 10, while by means of the new device, according to this definition, amplification factors from 100 to 1,000 were reached.

Similar structures are also used for the investigation of field effects on superconductor layers. Structures with an insulator thickness of approximately 160 nm, operated by means of gate voltages in the range of 30 volts, are discussed in J. Mannhart, J. G. Bednorz, K. A. Müller, D. G. Schlom: Electric Field Effect on Superconducting $YBa_2Cu_3O_7$ Films; Z. Phys. B—Condensed Matter 83, 307–311 (1991). Under the influence of this field strength, a change of resistance around 1% is observed in the superconductor. Although a very low gate current is recorded in this arrangement, this current has no influence on the supercurrent and is not relevant to the control mechanism. It should also be mentioned that pure field effect elements of this type are also known from semiconductor technology, in which they are also referred to as MIS (in that case: metal-insulator semiconductor).

A closer examination of the characteristic curves of the MIS transistor according to the invention shows the differences with respect to known devices more clearly. Thus, FIG. 2 also clearly shows the coupling between critical current and gate current; that is, the superconductor/normal-conductor transition starts exactly at that gate voltage at which the electron transfer through the gate electrode starts. When other materials are used for the structure, the threshold voltage may vary—typically in a range from 0.5 to 7 volts but the relationship between the injector current as shown in FIG. 2 and the critical current is always maintained. This permits the following conclusions:

The device according to the invention is not based on a pure field effect. A current conduction is at the gate or an injection effect is always necessary.

On the other hand, the effect cannot be explained solely by introduction of current. That is, if the insulator layer is omitted, and an injector current of the same magnitude is introduced by way of the gate directly into the superconductor, the illustrated switching effect is completely absent.

The gate current required for a measurable effect in the superconductor is so small that the direct effect of high-energy quasi-particles in the superconductor cannot be relied on to explain it.

The internal physical operating mechanism of the new MIS-element is not yet clear in all details. However, the most convincing interpretation is that the transition to the metallic condition which is produced by increasing the free electron density in the insulator layer, causes a proximity effect in the adjacent superconductor layer. The proximity effect results in a reduction of the energy gap of the superconducting electrons which leads to a lowering of the critical transition temperature. A further effect of the transition in the conversion layer could be that at the contact surface is forced to change its surface energy which results in a reduction of the pinning force. This, in turn, reduces the maximum superconducting current density. It is likely that both effects are responsible for the control effect. A reference in this respect is found, for example, in FIG. 3 (critical current as a function of the injector current) which it clearly shows two processes are involved, each having a different activation energy. In contrast, the introduction of electrons into the superconductor itself seems to have no influence (or only a secondary influence) on the control operation. Additional tests were carried out with respect to the functional dependence of the switching action, for example, by a variation of the temperature (FIG. 4), by using different materials and layer thicknesses or by using an external magnetic field. The results tend to confirm the above interpretation.

The electronic characteristics of this device, and its simple construction, offer very advantageous application possibilities. Although a portion of the structure—the gate electrode—consists of normally conducting metal, its wiring can be designed with a sufficient layer thickness and small distances, so that the ohmic losses caused in them may be kept negligibly low. For low-temperature superconductors, the gate electrode may also consist of a superconducting material so that an SIS-structure is created. With respect to high-temperature superconductor circuits, the MIS structure is very advantageous because it circumvents the previously mentioned technological problems of the manufacturing of superconducting multilayers.

The new device according to the invention can be used as a substitute for semiconductor transistors. For example, it can be used in hybrid circuits consisting of superconductors and semiconductors, which are operated, e.g., at 77 K, or in purely superconducting electronic circuits with an operation possibly also at helium temperature (4.2 K). The hard wiring must naturally be adapted to the characteristic diagram of the new device in such a manner that its switching, control and amplification function can be optimized.

Figure 3:
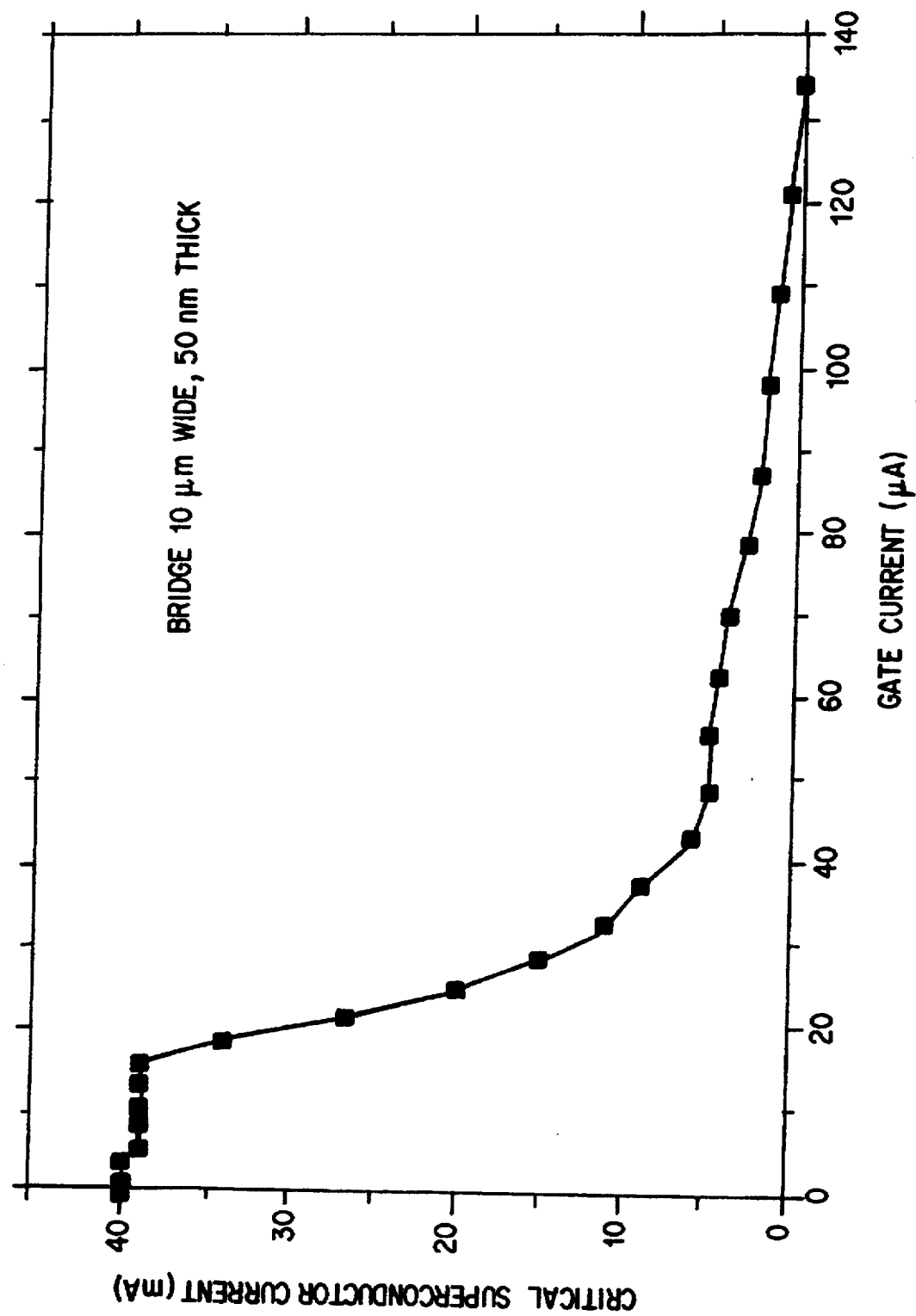
FIG. 3 is a graphic presentation of critical superconducting current as a function of gate voltage for the element according to the invention.
Figure 4:
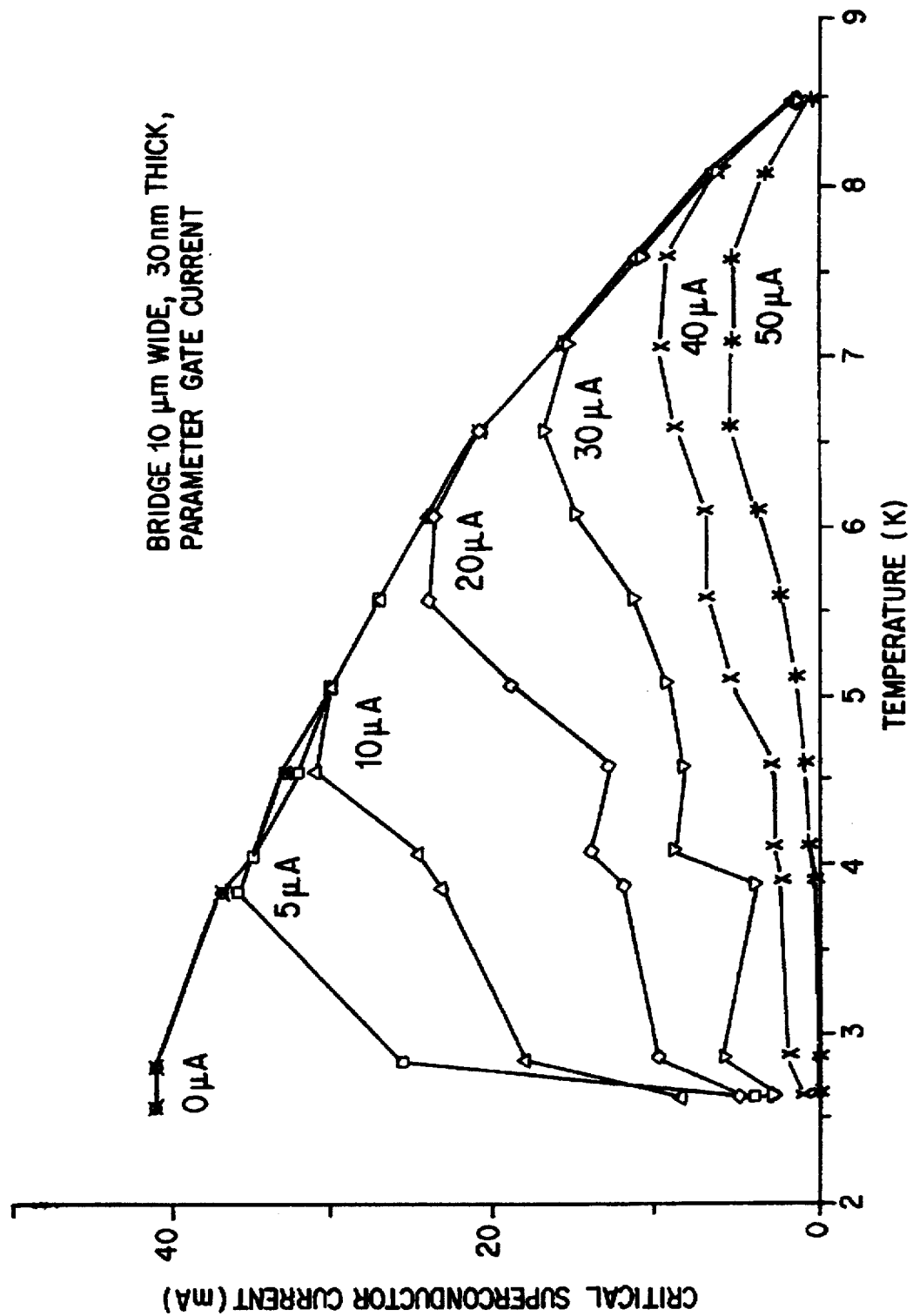
FIG. 4 is a graphic presentation of the relationship between critical superconductor current and temperature at varying levels of gate current.

As illustrated by the characteristic curve in FIG. 3, in addition, the apportioned change of the transport characteristics of the superconducting strip may also be of interest for special applications. In this case, high-frequency components, in particular, are considered in which the advantageous high-frequency characteristics of the superconductors are utilized. Thus, in the case of an already demonstrated superconducting component, such as a high-frequency resonator, the quality factor could be controlled by influencing a portion of the strip conductor. Other, more progressive attempts relate to new types of superconducting high-frequency devices, such as phase shifters, whose function is based on the change of the kinetic inductivity of a part of the conductor, or an oscillator with the new MIS device in the feedback loop.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A superconducting three terminal microelectronic thin film device comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer;

wherein said superconducting layer comprises a material selected from the group consisting of: niobium and $YBa_2Cu_3O_7$, and said conversion layer comprises a material selected from the group consisting of: niobium oxide, $V_2O_3$, NiS or $Ti_2O_3$.

2. A superconducting three terminal device according to claim 1 wherein said conversion layer undergoes said insulator-metal phase transition in response to application of an electric current to said gate electrode.

3. A superconducting three terminal device according to claim 1 wherein the gate electrode comprises a superconducting material.

4. A superconducting three terminal device according to claim 1 wherein the said superconducting layer is deposited on a substrate.

5. A cryo-electronic circuit having a superconducting three terminal current control device comprising:

a superconducting layer comprising a superconducting material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer;

said cryo-electric circuit having monolithically integrated circuits together with at least one of superconducting and semiconducting components;

wherein said superconducting layer comprises a material selected from the group consisting of: niobium and $YBa_2Cu_3O_7$, and said conversion layer comprises a material selected from the group consisting of: niobium oxide, $V_2O_3$, NiS or $Ti_2O_3$.

6. A cryo-electric switch comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and a gate electrode adjacent to and in electrical contact with said conversion layer, for conducting an electric current through said conversion layer, whereby the critical current of said superconducting layer is controlled;

wherein said superconducting layer comprises a material selected from the group consisting of: niobium and $YBa_2Cu_3O_7$, and said conversion layer comprises a material selected from the group consisting of: niobium oxide, $V_2O_3$, NiS or $Ti_2O_3$.

7. A cryo-electronic amplifier comprising:

a superconducting layer comprising a superconductor material having a thickness in the range of a coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer wherein said superconducting layer comprises a material selected from the group consisting of: niobium and $YBa_2Cu_3O_7$, and said conversion layer comprises a material selected from the group consisting of: niobium oxide, $V_2O_3$, NiS or $Ti_2O_3$.

8. A superconducting microelectronic switching device comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an insulator-metal transition in response to application of an electric current thereto, at a temperature below a critical temperature of said superconducting layer, and having a thickness greater than a layer thickness of a tunnel barrier, said thickness being on the same order of magnitude as a free path length of electrons in the conversion layer; and gate electrode means for applying an electric current to said conversion layer whereby electric conductivity of said superconducting layer is controlled by said electric current;

wherein said superconducting layer comprises a material selected from the group consisting of: niobium and $YBa_2Cu_3O_7$, and said conversion layer comprises a material selected from the group consisting of: niobium oxide, $V_2O_3$, NiS or $Ti_2O_3$.

9. A superconducting three terminal microelectronic thin film device comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer;

wherein said superconducting layer comprises a material selected from the group consisting of: niobium, lead, aluminum and $YBa_2Cu_3O_7$, and said conversion layer comprises a material selected from the group consisting of: compounds of transition metals.

10. Device according to claim 9 wherein said conversion layer comprises a material selected from the group consisting of: oxides of niobium, vanadium, tungsten and titanium.

11. A superconducting three terminal device according to claim 9 wherein the gate electrode comprises a superconducting material.

12. A cryo-electronic circuit having a superconducting three terminal current control device comprising:

a superconducting layer comprising a superconducting material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer;

said cryo-electric circuit having monolithically integrated circuits together with at least one of superconducting and semiconducting components;

wherein said superconducting layer comprises a material selected from the group consisting of: niobium, lead, aluminum and $YBa_2Cu_3O_7$, and said conversion layer comprises a material selected from the group consisting of: compounds of transition metals.

13. Cryo-electronic circuit according to claim 12 wherein said conversion layer comprises a material selected from the group consisting of: oxides of niobium, vanadium, tungsten and titanium.

14. A cryo-electric switch comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and a gate electrode adjacent to and in electrical contact with said conversion layer, for conducting an electric current through said conversion layer, whereby the critical current of said superconducting layer is controlled;

wherein said superconducting layer comprises a material selected from the group consisting of: niobium, lead, aluminum and $YBa_2Cu_3O_7$, and said conversion layer comprises a material selected from the group consisting of: compounds of transition metals.

15. Cryo-electric switch according to claim 14 wherein said conversion layer comprises a material selected from the group consisting of: oxides of niobium, vanadium, tungsten and titanium.

16. A cryo-electronic amplifier comprising:

a superconducting layer comprising a superconductor material having a thickness in the range of a coherence length of said superconducting layer;

a quasi-insulating conversion layer adjacent to and in contact with said superconducting layer, said conversion layer comprising a material which undergoes an electrically induced insulator-metal phase transition at a temperature below a critical temperature of said superconducting layer, and having a thickness greater than a layer thickness of a tunnel barrier, said thickness being on the same order of magnitude as a free path length of electrons in the conversion layer; and gate means comprising a gate electrode adjacent to and in electrical contact with said conversion layer, for controlling magnitude of a critical current of said superconducting layer by applying an electric current to said conversion layer;

wherein said superconducting layer comprises a material selected from the group consisting of: niobium, lead, aluminum and $YBa_2Cu_3O_7$, and said conversion layer comprises a material selected from the group consisting of: compounds of transition metals.

17. Cryo-electronic amplifier according to claim 16 wherein said conversion layer comprises a material selected from the group consisting of: oxides of niobium, vanadium, tungsten and titanium.

18. A superconducting microelectronic switching device comprising:

a superconducting layer comprising a superconductor material having a thickness in a range of a superconductor coherence length of said superconducting layer;

a quasi-insulating conversion layer adjacent to and in contact with said superconducting layer, said conversion layer comprising a material which undergoes an insulator-metal transition in response to application of an electric current thereto, at a temperature below a critical temperature of said superconducting layer, and having a thickness greater than a layer thickness of a tunnel barrier, said thickness being on the same order of magnitude as a free path length of electrons in the conversion layer; and gate electrode means for applying an electric current to said conversion layer whereby electric conductivity of said superconducting layer is controlled by said electric current;

wherein said superconducting layer comprises a material selected from the group consisting of: niobium, lead, aluminum and $YBa_2Cu_3O_7$, and said conversion layer comprises a material selected from the group consisting of: compounds of transition metals.

19. Superconducting microelectronic switching device according to claim 18 wherein said conversion layer comprises a material selected from the group consisting of: oxides of niobium, vanadium, tungsten and titanium.

* * * * *